United States Patent [19]

Metzner

[11] Patent Number: 4,549,133

[45] Date of Patent: Oct. 22, 1985

[54] MEASURING ARRANGEMENT FOR CAPACITIVE SECURITY FENCES

[75] Inventor: Uwe Metzner, Munich, Fed. Rep. of Germany

[73] Assignee: Siemens Aktiengesellschaft, Berlin & Munich, Fed. Rep. of Germany

[21] Appl. No.: 500,400

[22] Filed: Jun. 2, 1983

[30] Foreign Application Priority Data

Jun. 16, 1982 [DE] Fed. Rep. of Germany ....... 3222640

[51] Int. Cl.$^4$ ........................................... G01R 11/52
[52] U.S. Cl. .................................. 324/60 R; 340/564
[58] Field of Search .............. 340/561, 562, 564, 541; 324/60 R, 61 R, 60 C

[56] References Cited

FOREIGN PATENT DOCUMENTS 1220289 2/1967 Fed. Rep. of Germany .
2539501 3/1977 Fed. Rep. of Germany ...... 340/562
3110352A1 11/1982 Fed. Rep. of Germany .
0479056 7/1975 U.S.S.R. ........................... 324/60 R Primary Examiner—Stanley T. Krawczewicz
Assistant Examiner—Jack B. Harvey
Attorney, Agent, or Firm—Hill, Van Santen, Steadman & Simpson

[57] ABSTRACT

A plurality of transmitters operating at respective frequencies is connected to at least some electrodes of a capacitive security fence. Each electrode is provided with a transformer whose primary winding is connected between the transmitter and ground. The secondary of each transformer is connected to a plurality of bandpass filters having adjustable center frequencies which correspond to the transmitter frequencies. The voltage available at the outputs of the bandpass filters are fed to a measuring device and supplied to a microcomputer. The interelectrode capacitances and the self-capacitances of the electrodes of the system are identified from the measured voltages which are proportional to the capacitances.

11 Claims, 4 Drawing Figures

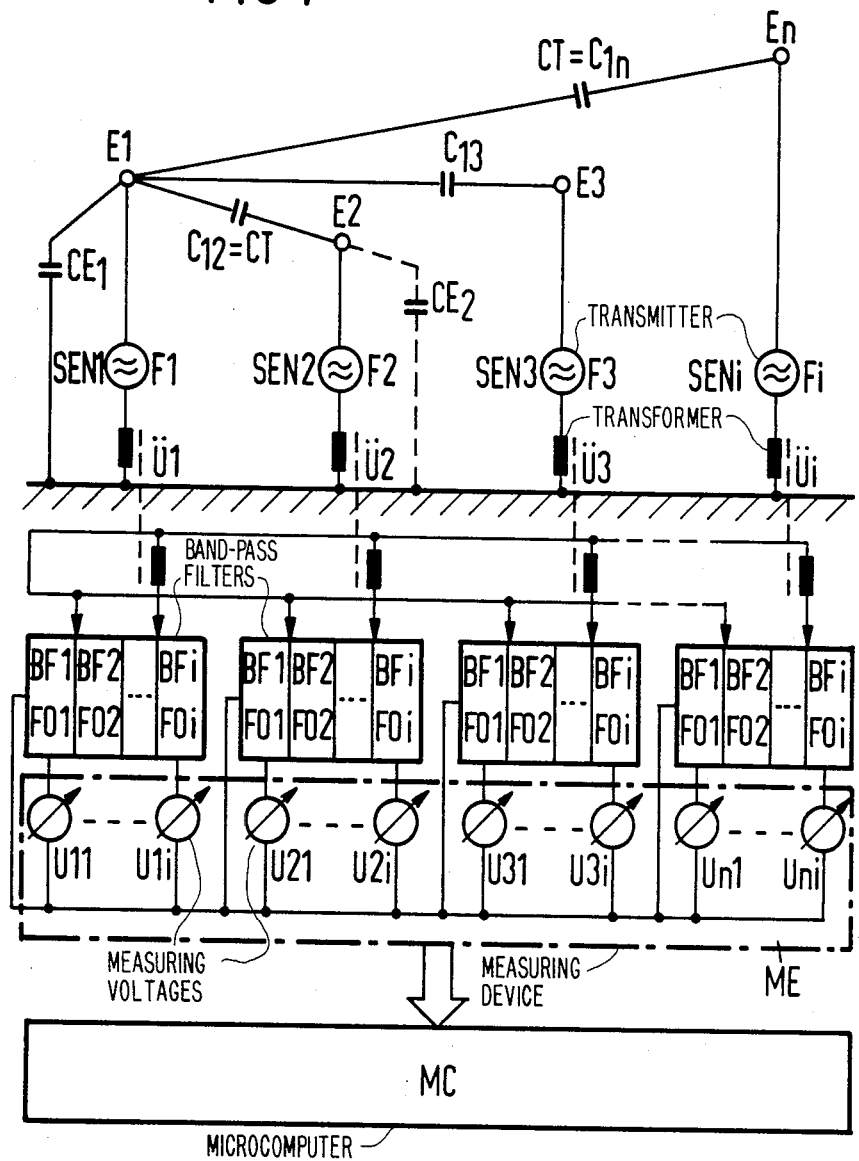

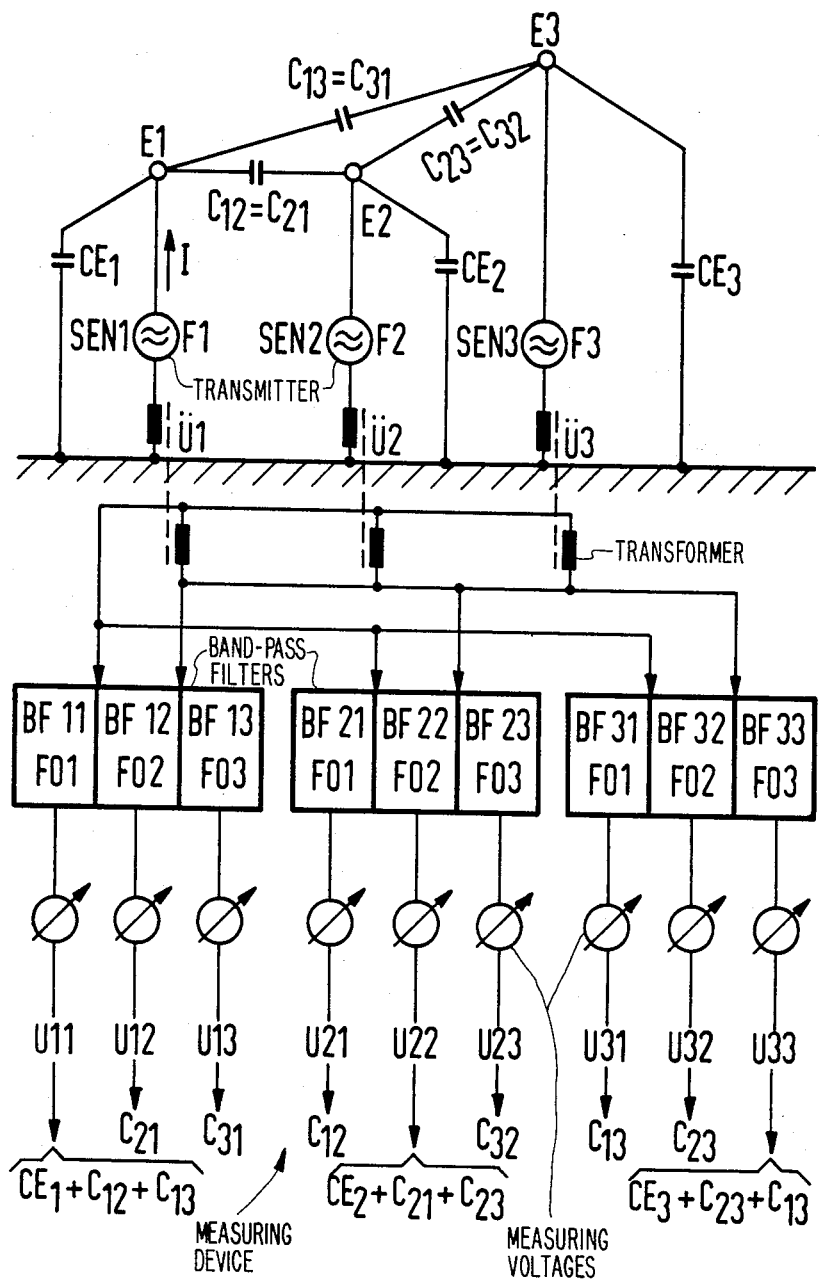

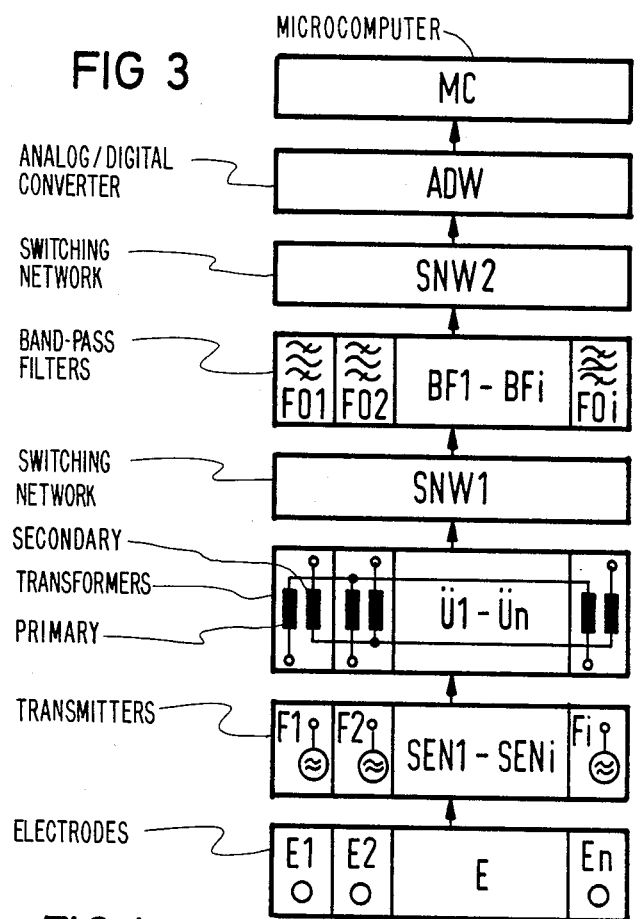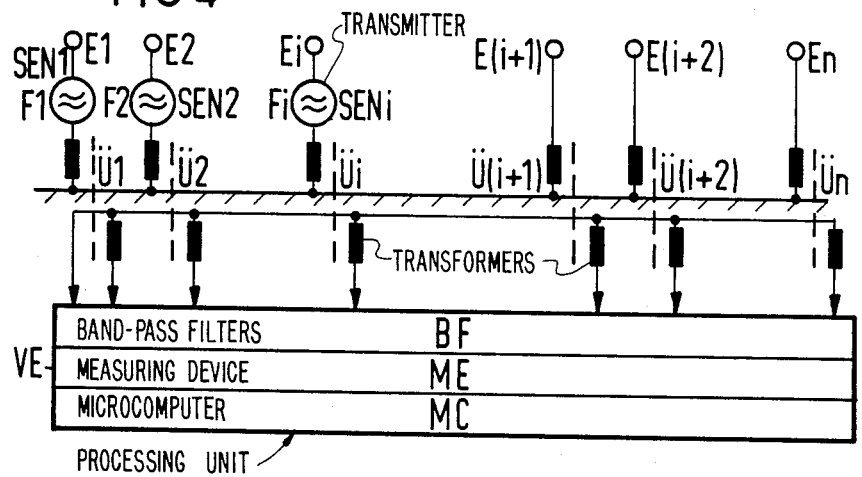

MEASURING ARRANGEMENT FOR CAPACITIVE SECURITY FENCES

BACKGROUND OF THE INVENTION

1. Field of the Invention

The present invention relates to a measuring arrangement for capacitive security fences having a plurality of electrodes for identifying the individual sub-capacities between two respective electrodes and the self-capacitance sub-capacity between a respective electrode and ground, in which alarm or interference criteria are derived in a central evaluation device from the identified capacitance values and alarm or interference reports are displayed.

2. Description of the Prior Art

In order to reliably secure an object, the surroundings are frequently secured, for example, with a security fence, in addition to building security. Unauthorized penetration is to be prevented, or at least made more difficult. In order to perceive unauthorized penetration, capacitive security fences are constructed which trigger an alarm given the approach or given the penetration of an intruder. Objects particularly in need of surveillance and subject to jeopardy, for example, nuclear power plants or military installations, require an extremely reliable ambient security system.

Such ambient security systems, particularly open-air systems, are subject to certain disruptive influences so that the susceptibility to disruption is relatively high and false alarms are frequently triggered. Ambient security systems must therefore be constructed such that the effects to be indicated reliably lead to an alarm, but disruptions do not. Usually, the interelectrode capacitances between transmission and reception electrodes are measured and the resulting difference of the interelectrode capacitance is evaluated by way of a differential bridge (for example as disclosed in the German Letters Pat. No. 1,220,298, fully incorporated herein by this reference). Symmetrically occurring environmental influences can thereby be eliminated. An alarm is derived from the resulting differential capacitance. An alarm is therefore triggered either due to a discontinuous change of capacitance of a specific size or due to a steady change of capacitance having a defined rate of change. These relatively simple alarm criteria, however, also produce low protection against interference. In order to be able to reliably perceive an intruder, the response sensitivity of such a system can be increased. This, however, also generally means that the susceptibility to interference also becomes greater, i.e. the immunity from interference is reduced.

It is likewise been proposed to respectively measure the individual interelectrode capacitances between the electrodes and/or the self-capacitances between an electrode and ground, to store and evaluate the time curves of the individual capacitance changes and to derive an alarm criterion therefrom, as disclosed in the German patent application No. P 31 10 352.9. Such a method, however, has the disadvantage that a multitude of involved transfer devices must be provided in the proximity of the electrodes and that relatively high potentials, for example, 100 volts, must be constantly connected to and disconnected from the individual electrodes. Moreover, only one interelectrode capacitance or, respectively, self-capacitance, can be measured at a time. This means a longer time until all capacitances are measured and are available for evaluation. Since the constant transfer causes certain transient problems, this time is further increased.

SUMMARY OF THE INVENTION

The object of the present invention, therefore, is to provide a measuring arrangement for identifying the individual interelectrode capacitances and/or self-capacitances at a capacitive security fence with which all interelectrode capacitances of an electrode system can be measured and the respective self-capacitance can be identified by way of a sum measurement. Thereby, all interelectrode capacitances should be capable of being measured simultaneously. The self-capacitance of the respective electrode should be derivable from the measured values of the interelectrode capacitances.

The above object is achieved, and a system of the type generally set forth above, in that a respective transmitter operating at a respective difference frequency is connected to the sum of the electrodes, in that each electrode has a transformer primary connected between the transmitter and ground, in that each transformer secondary is connected to a plurality of band-pass filters having adjustable center frequencies corresponding to the frequencies of the plurality of transmitters, in that all band-pass filters are connected to a measuring device with which the voltages for all center frequencies at all band-pass filters are measured, and in that all interelectrode capacitances and self-capacitances are identified from the measured voltages proportional to the capacitances, these being identified with a microcomputer following the band-pass filters.

The measuring arrangement, according to the present invention, therefore comprises a transmitter for each electrode and a transformer. Each transmitter operates at a different frequency. The secondary of each transformer is connected to as many band-pass filters as there are transmitters, their center frequencies corresponding to the transmitter frequencies. Given n electrodes and n transmitters, therefore, n times n band-filters are required. The band-pass filters are connected to a measuring device which measures the voltage available at the output of the respective band-pass filter. These voltages are proportional to the interelectrode capacitances or, respectively, to the sum of the interelectrode capacitances and self-capacitances of the electrode system. Given this arrangement, the transfer devices at the electrodes are eliminated, these being necessary when a respective transmitter is connected to all electrodes once and the remaining electrodes are connected as receiving electrodes. The high expense for filters is justified given a measuring arrangement constructed in accordance with the invention, since all capacitances can be simultaneously measured or, respectively, identified. The filters, further, need not be disposed in the direct proximity of the electrodes. They are advantageously disposed at the evaluation device. It is therefore advantageous to design the measuring arrangement as a part of a microcomputer in which the interelectrode capacitances or, respectively, self-capacitances and interelectrode capacitances can be stored for further processing.

Since all interelectrode capacitances and self-capacitances need not be measured and evaluated in many instances in order to recognize an intruder, fewer transmitters than electrodes can be provided. The number of filters is thereby likewise reduced.

In accordance with an advantageous feature of the invention, the measuring arrangement operates in a multiplex mode. A first switching network is provided between the transformers and the band-pass filters; the plurality of band-pass filters is thereby reduced by the factor n. Therefore, the number of required band-pass filters is reduced to the number of connected transmitters. Given, for example, four electrodes with four assigned transmitters, the four transformers are connectible to the four band-pass filters with the first switching network. Given four band-pass filters, four switching steps are required in order to connect each transformer once to each filter. Their respective voltages are thereby measured and the corresponding capacitance values are identified in the microcomputer. A second switching network can be similarly provided between the band-pass filters and analog/digital converters receiving the computer in order to therefore reduce the number of analog/digital converters of the filters to n in number.

A crystal-controlled master generator is thereby advantageously provided for generating the various transmission frequencies, the master generator being controlled by way of a divider, for example, a Siemens AG SAB 8253, preceding the computer. The i band-pass filters will likewise be realized via a phase-sensitive rectifier circuit.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a schematic representation of a measuring arrangement constructed in accordance with the invention and having n electrodes annd $i=n$ transmitters;

FIG. 2 is a schematic representation of a measuring arrangement constructed in accordance with the invention and having three electrodes and three transmitters;

FIG. 3 is a block diagram of a measuring arrangement, constructed in accordance with the invention, and operating in a multiplex mode; and FIG. 4 is a schematic representation of a measuring arrangement constructed in accordance with the invention and having fewer transmitters than electrodes ($i<n$).

DESCRIPTION OF THE PREFERRED EMBODIMENTS

The electrodes E1—En are schematically illustrated in FIG. 1 for a security fence. Each electrode is connected to a transmitter SEN1—SENi, so that $i=n$. Each transmitter generates a frequency which differs from the frequency of the other transmitters (F1—Fi). A respective transformer Ü1—Üi is connected between a respective transmitter and ground. Respective band-pass filters BF1—BFi are connected in parallel to the secondaries of the transformers. The center frequencies F01—F0i correspond to the respective transmitter frequencies F1—Fi. The respective measuring voltage (U11—Uni) is identified at each band-pass filter (BF1—BFi) with a measuring device ME. These voltages are proportional to the capacitances of the electrode system. The capacitances are identified in a microcomputer MC which is connected to the measuring device ME.

Given such a measuring arrangement, all electrodes are transmission electrodes. In the voltage measurement after the band-pass filters, however, only the electrode, for example the electrode E1, to which a band-pass filter whose center frequency is identical to the transmission frequency of the electrode assigned thereto is effective as a transmission electrode. In this case, the transmitter SEN1 is connected to the electrode E1 so that the voltage U11 at the output of the band-pass filter BF1 is in a specific relationship to the current I which flows to the electrode E1. The measuring voltage U11 is proportional to the capacitances $C_{E1}+{}^n=2\cdot C_{1i}$, the voltage U12 is proportional to the capacitance $C_{12}$ and the voltage U1i is proportional to the capacitance $C_{1n}$.

Given sufficiently low output impedances of the transmitters SEN and sufficiently low impedances of the transformers U, the electrodes act as though grounded and, therefore, act as receiving electrodes. With this measuring arrangement, each electrode is a transmission electrode once and the remaining electrodes are receiving electrodes without their being a requirement for a constant transfer of the electrodes from one condition to the other. Moreover, all interelectrode capacitances and self-capacitances can be determined in this manner from the simultaneously-measured voltages.

For the sake of simplicity, it will be assumed that the measuring voltages and the proportional capacitances are such that there are three electrodes $n=3$ and three transmitters $i=3$ as illustrated in FIG. 2. Respectively three band-pass filters BF1—BF3 are assigned to each transformer Ü1—Ü3, i.e. a total of nine band-pass filters BF11—BF33. Nine voltages U11—U33 are accordingly measured. The voltage U11 measured at the band-pass filter BF11 with the center frequency F01 is proportional to the sum of the self capacitance $CE_1$ plus the interelectrode capacitance $C_{12}$ of the electrode E1 relative to the electrode E2 plus the interelectrode capacitance $C_{13}$ of the electrode E1 relative to the electrode E3. The voltage U12 at the output of the band-pass filter BF12 is proportional to the interelectrode capacitance $C_{21}$ between the electrodes E2 and E1 and the voltage U13 available at the output of the band-pass filter BF13 is proportional to the interelectrode capacitance $C_{31}$ between the electrodes E3 and E1.

The analogous case applies to the voltages at the other band-pass filters, as can be seen from FIG. 2. Therefore, for example, the voltage U21 at the output of the band-pass filter BF21 is proportional to the interelectrode capacitance $C_{12}$. As the result of differential measuring paths, the interelectrode capacitance $C_{12}$ and the interelectrode capacitance $C_{21}$ can be determined in this manner, these necessarily being of the same size ($C_{21}=C_{12}$) An additional control criterion for evaluating the changes of capacitance at the capacitive security fence derives therefrom.

A measuring arrangement which employs two switching networks is illustrated in block form in FIG. 3. As viewed from bottom to top, the electrodes E1—En are illustrated at the bottom, these being connected to the transmitters SEN1—SENi having the respective frequencies F1—Fi. The transformers Ü1—Üi have their primaries connected between the transmitters and ground. The secondaries of the transformers Ü1—Üi are connected to band-pass filters BF1—BFi by way of a first switching network SNW1, the band-pass filters being provided only once for all electrodes. The band-pass filters BF1—BFi are connected by way of a second switching network SNW2 to an analog/digital converter ADW, which includes a plurality of analog/digital converters, which is connected to a microcomputer MC. Given, for example, four electrodes E1—E4 with four transmitters SEN-1—SEN4, the switching network SNW1 connects the four transformers U1—U4 to the four band-pass filters BF1—BF4 in a first switching step so that the transformer Ü1 is connected to the band-pass filter BF1, the transformer U2 is connected to the band-pass filter BF2, etc. In a second switching step, the transformer Ü1 is connected to the band-pass filter BF4, the transformer Ü2 is connected to the band-pass filter BF1, the transformer Ü3 is connected to the band-pass filter BF2 and the transformer Ü4 is connected to the band-pass filter BF3. Given four transmission electrodes, each transformer is connected to each band-pass filter once in four switching steps.

A similar switching network SNW2 is necessary when the number of analog/digital converters provided between the band-pass filters BF1—BFi and the microcomputer MC is not greater than the number of connected transmitters. The plurality of analog/digital converters is also reduced by the factor n here in a multiplex mode.

In FIG. 4, the electrodes E1—Ei are operated as transmitting electrodes, i.e. they are respectively connected to a transmitter SEN1—SENi and, over the primary of a respective transformer Ü1—Üi, are connected to ground. The remaining electrodes E(i+1)—En are connected directly to ground over a respective primary winding of the transformers U(i+1)—Un. The secondaries of all transformers are connected to the band-pass filters BF11—BFni or, given a multiplex mode, are connected via a switching network SNW1 to the band-pass filters BF11—BFi. The outputs of the bandpass filters BF are connected to the measuring device ME and to the microcomputer MC. The band-pass filters BF, the measuring device ME and the microcomputer MC in FIG. 4 are illustrated as a processing unit VE.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A measuring arrangement for a capacitive security fence which has a plurality of electrodes which have capacitances between the electrodes and self-capacitance for each electrode with respect to ground, comprising:
a plurality of transmitters connected to respective ones of at least some of the electrodes and operable at respective different frequencies;
a plurality of transformers each including a secondary, and a primary connecting a respective transmitter to ground;
a plurality of band-pass filters connected to said secondaries and having adjustable center frequencies corresponding to the frequencies of said transmitters; and
measuring means connected to said plurality of band-pass filters and operable to identify the capacitances and self-capacitances which are proportional to the voltages measured at the center frequencies of said plurality of band-pass filters.

2. The arrangement of claim 1, wherein: said measuring means comprises a microcomputer.

3. The arrangement of claim 2, wherein:
said microcomputer comprises memory means which, given simultaneous measurement of the measuring voltages, is operable to store capacitance and self-capacitance information which may be read for deriving an alarm or interference criteria.

4. The arrangement of claim 3, wherein:
said measuring means comprises analog/digital conversion means connected between said band-pass filters and said microcomputer.

5. The arrangement of claim 1, wherein:
said plurality of transmitters is equal to the number of electrodes.

6. The arrangement of claim 1, wherein:
said plurality of transmitters is less than the number of electrodes.

7. The arrangement of claim 1, wherein the number of band-pass filters is equal to the number of transmitters, and further comprising:
switching means connected between said secondaries and said band-pass filters and between said band-pass filters and said measuring means and operable to selectively connect said band-pass filters to said transmitters and said measuring means.

8. The arrangement of claim 1, comprising:
a computer-controlled frequency divider and a crystal-stabilized master frequency generator connected to said divider to constitute said plurality of transmitters.

9. The arrangement of claim 1, wherein:
each of said band-pass filters comprises phase-dependent rectifier means.

10. A measuring arrangement for a capacitive security fence which has a plurality of electrodes which have capacitances between the electrodes and self-capacitance for each electrode with respect to ground, comprising:
a plurality of transmitters connected to respective ones of at least some of the electrodes and operable at respective different frequencies;
a plurality of transformers each including a secondary, and a primary connecting a respective transmitter to ground;
a plurality of band-pass filters connected to said secondaries and having adjustable center frequency corresponding to the frequencies of said transmitters; and
measuring means connected to said plurality of band-pass filters and operable to produce a respective signal for each electrode which is proportional to the sum of capacitance of the electrode with respect to all other electrodes and its self capacitance.

11. A measuring arrangement for a capacitive security fence which has a plurality of electrodes which have capacitances between the electrodes and self-capacitance for each electrode with respect to ground, comprising:
a plurality of transmitters connected to respective ones of at least some of the electrodes and operable at respective different frequencies;
a plurality of transformers each including a secondary, and a primary connecting a respective transmitter to ground;
a plurality of band-pass filters connected to said secondaries and having adjustable center frequencies corresponding to the frequencies of said transmitters; and
measuring means connected to said plurality of band-pass filters and operable in response to a pair of the measured voltages to identify the capacitance between the two respective electrodes.

* * * * *